United States Patent [19]
Binder

[11] Patent Number: 5,892,408
[45] Date of Patent: Apr. 6, 1999

[54] METHOD AND SYSTEM FOR CALIBRATING A CRYSTAL OSCILLATOR

[76] Inventor: Yehuda Binder, 30 Yeshurun Street, Hod Hasharon 45200, Israel

[21] Appl. No.: 795,525

[22] Filed: Feb. 5, 1997

[51] Int. Cl.$^6$ ..................................................... H03B 5/32
[52] U.S. Cl. ............................... 331/44; 331/66; 331/176
[58] Field of Search .............................. 331/44, 66, 176, 331/70

[56] References Cited

U.S. PATENT DOCUMENTS

| | | | |
|---|---|---|---|
| 4,611,181 | 9/1986 | Fukumura et al. | 331/66 |
| 4,712,078 | 12/1987 | Slobobodnik, Jr. et al. | 331/176 |
| 4,746,879 | 5/1988 | Ma et al. | 331/44 |
| 4,910,473 | 3/1990 | Niwa | 331/66 |
| 4,922,212 | 5/1990 | Roberts et al. | 331/176 |
| 5,081,431 | 1/1992 | Kubo et al. | 331/176 |
| 5,162,758 | 11/1992 | Onishi | 331/176 |
| 5,170,136 | 12/1992 | Yamakawa et al. | 331/176 |
| 5,392,005 | 2/1995 | Bortolini et al. | 331/44 |
| 5,428,319 | 6/1995 | Marvin et al. | 331/176 |
| 5,731,742 | 3/1998 | Wojewoda et al. | 331/44 |

*Primary Examiner*—Son T. Dinh
*Attorney, Agent, or Firm*—Browdy and Neimark

[57] ABSTRACT

A method and system are provided for calibrating a batch of devices each containing a circuit which is responsive to a control signal for producing a desired output which varies in accordance with a first predetermined function of a specific ambient condition, the control signal having a magnitude which varies as a second predetermined function of the specific ambient condition, the second function being based on data stored as a look-up table in a memory of the device and which must be individually calibrated for each device. In a preferred embodiment, the device is a digital temperature controlled crystal oscillator which produces a desired output frequency and includes a voltage controlled oscillator (VCO) responsive to a control signal having a magnitude which varies as a predetermined function of ambient temperature in order to compensate for temperature variations in the oscillator output frequency. For such an application, the invention requires the connection of an accurate frequency source to each oscillator in the batch so as to enable the output frequency of the oscillator to be equalized thereto or to a multiple thereof. In calibration mode, the digital equivalent of the resulting analog control voltage is stored; whilst in compensation mode it is extracted from the memory, converted to an equivalent analog voltage and applied to the VCO. The invention is also applicable to compensate for aging of crystal oscillators in the field without requiring reconfiguring the complete look-up table.

66 Claims, 13 Drawing Sheets

METHOD AND SYSTEM FOR CALIBRATING A CRYSTAL OSCILLATOR

FIELD OF THE INVENTION

This invention relates generally to electronic devices whose output is dependent on an ambient condition, such as temperature, and which have digital compensation for stabilizing the output for variations in the ambient condition. More specifically the invention relates to temperature compensated oscillators and, in particular, to a method for compensating such oscillators for temperature and aging effects during manufacture and field calibration.

BACKGROUND OF THE INVENTION

FIG. 1 shows a generic block diagram of a conventional digital temperature-controlled crystal oscillator (DTCXO) of the kind described, for example, in U.S. Pat. No. 4,746,879 to Ma, et al. The oscillator designated generally as 10 is based on a voltage controlled crystal oscillator (VCXO) 11 to which a temperature-dependent voltage control signal is fed in order that the frequency of the signal generated by the VCXO 11 is substantially invariant regardless of fluctuations in temperature. In order to generate the correct compensating temperature-dependent voltage control signal, there is provided a temperature sensor 12 for producing an analog signal representative of the ambient temperature. The analog temperature signal generated by the temperature sensor 12 is converted to a digital equivalent signal by an analog-to-digital (A/D) converter 13 and is fed as an address to a non-volatile memory such as an EEPROM 14 which serves as a look-up table for storing a corresponding temperature-compensating tuning voltage.

The digital temperature compensation value stored in the memory 14 is converted by a digital-to-analog (D/A) converter 15 to an equivalent analog signal and represents the correct analog voltage for the corresponding ambient temperature for generating the desired frequency from the VCXO 11. The various components in the system are responsively coupled to a timing logic and control unit 16 so as to allow access to the look-up table constituted by the non-volatile memory 14, in order to allow the correct temperature-compensating voltage value to be read from the non-volatile memory 14 corresponding to the instantaneous ambient temperature as derived by the temperature sensor 12 and fed to the non-volatile memory 14 via the A/D converter 13.

The operating principles of piezoelectric crystal oscillators which form the basis of DTCXOs are well described in above-referenced U.S. Pat. No. 4,746,879. It is noted in the opening section of this reference that the frequency versus temperature characteristics of piezoelectric crystals are determined primarily by the angles of cut of the crystal plates with respect to the crystallographic axes of quartz. Since there inevitably exist slight differences between the angles of cut in different crystals, the frequency versus temperature characteristics of different crystal oscillators are inevitably slightly different, thus requiring separate, customized temperature-compensation look-up table for each crystal oscillator. This requirement represents a significant manufacturing problem since the data stored in the non-volatile memory 14 must be separately calibrated for each crystal oscillator 10 in turn and is thus not susceptible to large scale mass production.

The patent literature also discloses various approaches for saving memory in look-up tables associated with digital temperature compensated oscillators. For example, U.S. Pat. No. 4,922,212 to Roberts et al. discloses an oscillator temperature compensating circuit using stored and calculated values. Specifically, a calculator calculates the value of a function representing the portion of the oscillator temperature-frequency transfer curve corresponding to the ambient temperature as measured by a suitable temperature sensor. A signal corresponding to the calculated value is then applied to the oscillator as the control voltage. The oscillator temperature-frequency transfer curve is partitioned into a plurality of segments for each of which an offset value equal to the difference between the voltage magnitude at the start of the segment and the desired voltage magnitude, is stored in a look-up table. When a compensating signal value is required, the compensating signal value calculator retrieves from the look-up table the offset values corresponding to the three points defined by the start and end values of the two segments, respectively preceding and succeeding the segment containing the ambient temperature. This allows for the use of standard curve fitting techniques to compute a parabola passing through the three points retrieved from the look-up table, thus permitting computation of the actual compensating signal value for the ambient temperature. Such a technique obviates the need for a very complex function to be determined for the whole frequency-temperature transfer function whilst allowing discrete points of the frequency transfer curve to be stored at sufficiently coarse resolution to provide a significant saving in the required memory for storing the look-up table.

U.S. Pat. No. 5,170,136 to Yamakawa et al. discloses a DTCXO wherein voltage deviations corresponding to differences between the ambient temperature and a plurality of nominal temperatures over the complete working range of the oscillator may be derived in order to determine the correct compensation voltage to be either added to, or subtracted from, the present control voltage in order to produce the required frequency drift.

Likewise, U.S. Pat. No. 5,548,252 to Watanabe et al. discloses a digital control system for reducing the memory capacity in a DTCXO.

What all of these references have in common is the use of interpolational curve fitting techniques to reduce memory capacity. The actual values themselves, albeit fewer in number, which are stored in the look-up table, and which serve as the basis for the calculation of control voltages, must still, in all cases, be determined for each sampled temperature, which itself must be known. This requires accurate temperature stabilization and complex control circuitry as noted above, and complex setup as explained below with particular reference to FIG. 2.

Also worthy of note is U.S. Pat. No. 4,712,078 to Slobodnik, Jr. et al. which discloses a digital compensation circuit for improving the temperature stability of dielectric resonator oscillators. This patent demonstrates yet another use for digital compensation circuitry beyond temperature compensated crystal oscillators. Specifically, Slobodnik, Jr. et al. employ a temperature sensor for indicating a measure of ambient temperature which is correlated with an amount of phase shift necessary to compensate the frequency drift in the dielectric resonator oscillator. The correlation is made using a correction table or correction function which is determined empirically in a calibration process. The necessary phase shift is then supplied by a voltage controlled phase shifter.

FIG. 2 shows schematically a typical producing setup for calibrating the respective look-up tables constituted by the non-volatile memory 14 in a batch of crystal oscillators as shown in FIG. 1. Thus, there is shown a batch 20 of digital temperature-controlled crystal oscillators designated $DTCXO_1$, $DTCXO_2$ . . . $DTCXO_N$, 21, 22 and 23, respectively. Each of the digitally controlled crystal oscillators in the batch 20 is placed in a temperature-controlled oven 24 and is individually coupled via respective buses 25, 26 and 27 to a control logic and processing unit 28. An output 29 of each of the digital temperature-controlled crystal oscillators 21, 22 and 23 is fed to the control logic and processing unit 28 so as to allow testing of the signal frequency generated by the respective oscillator. Such an arrangement is also shown and described in above-referenced U.S. Pat. No. 4,746,879 wherein FIG. 2 shows a block diagram of a computer-controlled test system for multiplexing a frequency counter to up to eight individual oscillators and measuring the output frequency of each one through a calibration and test circuit. The computer test system is provided with a highly accurate temperature sensor which serves as an absolute temperature test reference for test data and provides proper initiation of the calibration sequences. The multiplexers permit simultaneous testing and calibration of a plurality of temperature-controlled oscillators.

Such a process suffers from numerous drawbacks. First, the multiplexing requires complicated and expensive production setup which also requires expensive cabling whilst being limited in the number of crystal oscillators which can be calibrated during a single run. Also, each connection to the DTCXO is effected via a plurality of lines thus further increasing the complexity of each device. Furthermore, normally two runs are required: one for calibration and the second for verification testing. In above-referenced U.S. Pat. No. 4,746,879, the testing and calibration is performed simultaneously but at the expense of an additional multiplexer, thus complicating even further the production setup and increasing still further the cost of cabling. An additional drawback is that there are provided two temperature sensors which must be precisely matched to give the same reading. This requires that both of the temperature sensors be stabilized and thus the heating process is very lengthy and time consuming. Such a problem is inherent in any system wherein the oscillator is calibrated for a plurality of specific known temperatures.

Further, as is also noted in above-referenced U.S. Pat. No. 4,746,879, the stability of the frequency of a crystal oscillator of the kind described is gradually eroded as a result of crystal aging. As the crystal ages, the entire temperature-frequency transfer curve is shifted up or down. As is also noted, the use of crystal oscillators as reference modules in cellular telephones in particular requires them to be extremely compact and further requires a high degree of frequency stability so as to meet FCC requirements. As a result, conventional crystal oscillator-based cellular telephones have to be serviced periodically in order to adjust the oscillator unit to account for any frequency instability consequent to crystal aging. In order to allow proper compensation for crystal aging, one known arrangement allows for the voltage control signal to be fed to the oscillator via a potentiometer so that the offset voltage can be easily adjusted manually. In use, a very accurate frequency meter is fed to the output of the crystal oscillator so as to measure the frequency correctly so that, in the event of any discrepancy between the desired and actual frequency, the potentiometer may be manually adjusted until the two match. This calibration is not amenable to batch operation and must be performed individually in respect of each crystal oscillator and the oscillator must be physically accessible. Moreover, such calibration must be performed at a specific temperature according to the manufacturer's data specification which, in turn, may require the use of a temperature-controlled oven.

Some improvement in the calibration setup is achieved by U.S. Pat. No. 5,392,005 to Bortolini, et al. which allows re-calibration of crystal oscillators to be performed in the field. This may be accomplished by employing an accurate external reference signal to determine when the frequency of the digital temperature-compensated crystal oscillator has drifted from the reference signal in excess of a specification. Any difference between the measured frequency of the oscillator and the external reference signal is then due to aging, requiring a new compensation value for the instantaneous ambient temperature to be calculated using the reference signal. The technique disclosed by Bortolini, et al. is based on the assumption that any frequency drift due to crystal aging is constant throughout the working temperature range of the crystal oscillator. Thus, FIG. 2 of the Bortolini patent shows an original calibration curve and an up-dated calibration curve which is parallel thereto: thus indicating a constant frequency drift which is itself temperature-independent. Bortolini, et al. then simply adjust the values of the temperature compensation voltage magnitude in the look-up table in order to add or subtract a constant value representative of the constant frequency drift. Additionally, the method described requires processing power (CPU) in each unit and, since the measurement process is time-consuming, the temperature must be stabilized throughout the process thus requiring an oven.

In practice, however, this approach is overly simplistic and thus prone to inaccuracy because it takes no account of the so-called "trim effect". Specifically, although it is true that the frequency drift is constant throughout the whole temperature range of the crystal oscillator, the control voltage which is required to achieve this drift is itself not constant throughout the complete range. Non-linearities are particularly likely to occur, for example, at the extremities of the working temperature of the crystal oscillator and Bortolini, et al. make no allowance for such non-linearities. On the other hand, the use of a reference frequency signal appears to be suggested for the first time by Bortolini, et al.: albeit only for field adjustment of crystal oscillators to allow for aging. Thus, there appears to be no suggestion in the prior art to employ a reference signal already during the manufacturing process; nor is there any suggestion as to how this could be used to simplify the calibration, during manufacture, of a batch containing a large number of digital temperature-controlled crystal oscillators.

Solutions to the above-described problem of trim effect are offered in U.S. Pat. Nos. 5,428,319 and 5,081,431. However, the solutions proposed therein involve complex circuitry, processing power and setup procedures during production and periodic aging calibration. Furthermore, the above-mentioned patents offer no simplification of the setup needed to perform periodic aging calibration.

SUMMARY OF THE INVENTION

It is thus a principal object of the present invention to provide a method for calibrating a batch of digital crystal oscillators wherein the drawbacks associated with hitherto proposed methods are significantly reduced or eliminated.

A further object of the present invention is to allow extension of such an approach so as to allow for easy field re-calibration of a crystal oscillator in order to compensate for aging drift thereof.

Thus, according to the invention there is provided a method for calibrating a batch of at least one device containing a circuit which is responsive to a control signal for producing a desired output which varies in accordance with a first predetermined function of a specific ambient condition, the control signal having a magnitude which varies as a second predetermined function of said specific ambient condition, said second function being based on data stored in a memory of the device and which must be individually calibrated for each device, said method comprising the steps of:

(a) subjecting all of the devices in the batch to a controlled environment wherein said ambient condition may be varied, (b) connecting to the devices an accurate signal source whose output varies in accordance with said second predetermined function of the ambient condition, (c) selecting a "calibration mode" of operation wherein said function is determined for a measured ambient condition and the data corresponding thereto is stored in the memory and wherein there are performed the following steps for each device in the batch:

(i) determining the value of the required control signal for producing an output signal of the desired output magnitude, (ii) storing the respective value of the control signal or a function thereof in the memory of each device, and (iii) repeating steps (i) and (ii) in respect of different ambient conditions until each value is stored in the memory; and (d) selecting a "compensation mode" of operation wherein data is extracted from the memory and used in conjunction with a measured ambient condition for adjusting the control signal.

The device may be any device producing a fixed-frequency signal whose magnitude may be voltage controlled. Typically, the device is a crystal oscillator having a voltage-controlled element.

In such case, the approach according to the invention requires only one signal, corresponding to the frequency reference, to be fed to all of the crystal oscillators in the batch for the purpose of calibration during mass production. If all that is of concern is the ability to calibrate large numbers of crystal oscillators during manufacture, then the logic and control unit to which the various components of the crystal oscillator are responsively coupled may be provided as an external unit. Alternatively, the logic and control unit can be integrated within the digital temperature-controlled crystal oscillator so as to allow temperature compensation thereof also to be carried out in the field by means of the sole external connection thereto of a suitable reference frequency signal.

BRIEF DESCRIPTION OF THE DRAWINGS

In order to understand the invention and to see how the same may be carried out in practice, some preferred embodiments will now be described, by way of non-limiting example only, with reference to the accompanying drawings, in which.

DETAILED DESCRIPTION OF PREFERRED EMBODIMENTS

Figure 2:
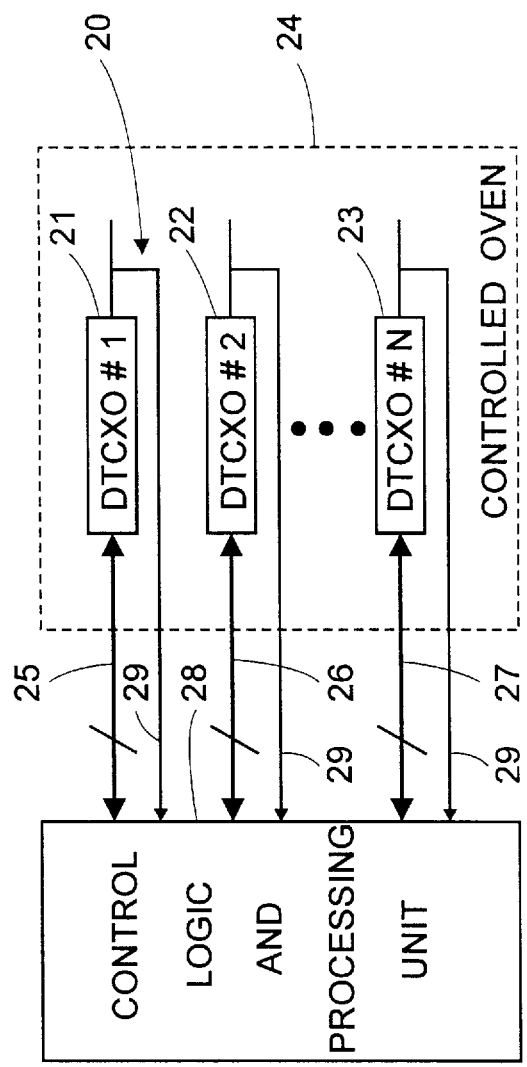
FIG. 2 is a schematic diagram of a conventional prior art production setup for mass-calibration of a batch of digital temperature-controlled crystal oscillators.
Figure 3:
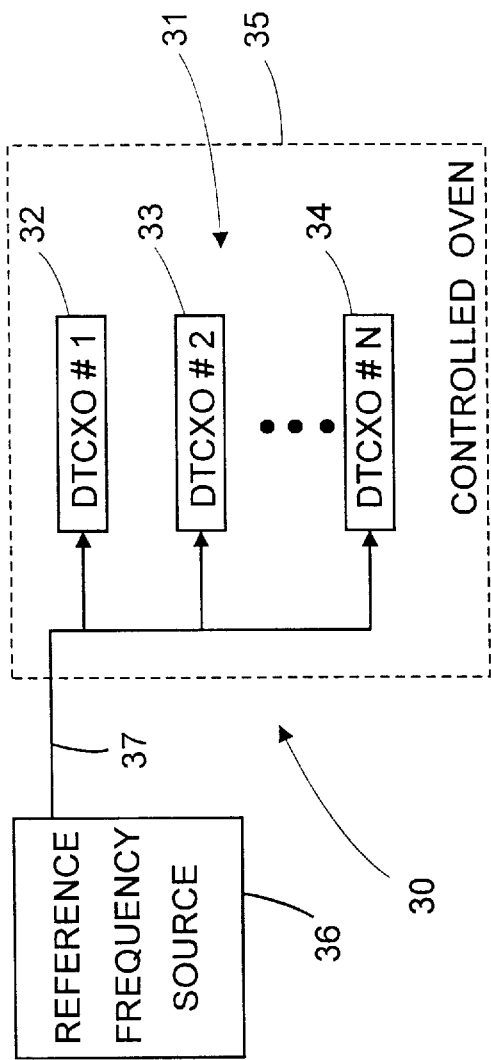
FIG. 3 is a schematic diagram of a setup procedure according to the invention for mass-calibration of a batch of digital temperature-controlled crystal oscillators.

In the following description and accompanying figures, identical reference numerals are employed for those components which are common to different embodiments. FIG. 3 shows a production setup designated generally as 30 wherein a batch 31 of digital temperature-controlled crystal oscillators designated $DTCXO_1$, $DTCXO_2$ ... $DTCXO_N$ 32, 33 and 34, respectively are placed in a temperature-controlled oven 35 in a manner similar to that described above with reference to FIG. 2 of the drawings. An external reference frequency source 36 is commonly connected to each of the digital temperature-controlled crystal oscillators 32, 33 and 34 in a manner which will be described in greater detail below with reference to FIG. 4 of the drawings. However, it is to be noted that the production setup 30 shown in FIG. 3 does not require an external control unit (corresponding to the computer 101 disclosed by Bortolini, et al.) and, further, obviates the need for complex multiplexing to the control unit via separate buses coupled to each of the digital temperature-controlled crystal oscillators. Specifically, the reference frequency source 36 of the invention is connected to each of the digital temperature-controlled crystal oscillators 32, 33 and 34 via a single wire 37 allowing for a simple serial inter-connection between the reference frequency source 36 and each of the digital temperature-controlled crystal oscillators 32, 33 and 34. Since the complexity of the cabling 37 is in no way increased regardless of the number of digital temperature-controlled crystal oscillators in the batch 31, the maximum number of digital temperature-controlled crystal oscillators which may be accommodated in a given batch 31 is limited principally by the size of the oven 35.

Figure 1:
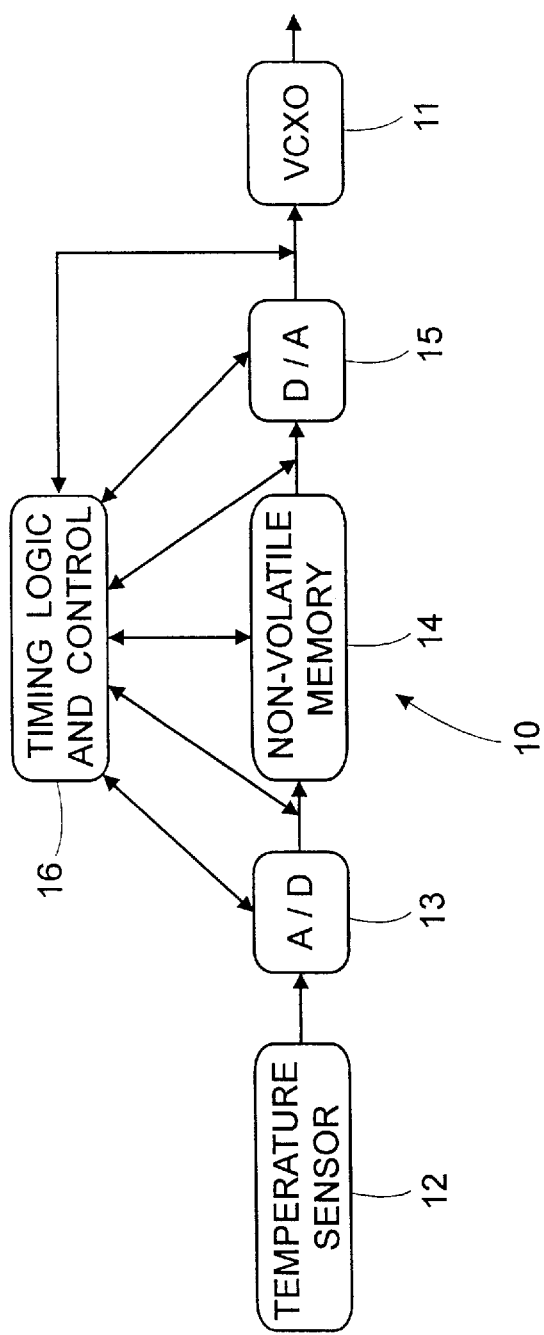
FIG. 1 is a generic block diagram of a typical prior art digital temperature-controlled crystal oscillator.
Figure 4:
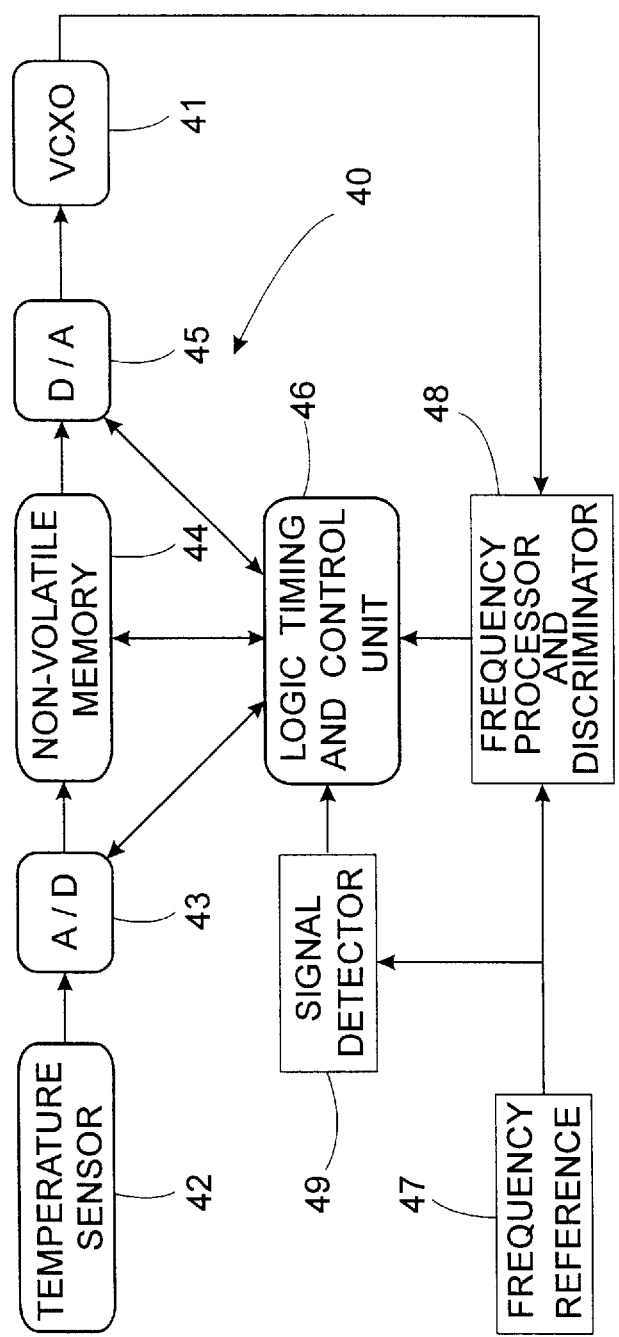
FIG. 4 is a schematic diagram showing conceptually a system for calibrating a crystal oscillator according to the invention.

Referring to FIG. 4 there is shown schematically, a DTCXO calibration system 40 in accordance with the invention comprising a VCXO 41 having coupled thereto, in known manner, a temperature sensor 42, an A/D converter 43, a look-up table constituted by a non-volatile memory 44 and a D/A converter 45 all of which are responsively coupled to a logic and control unit 46 in a manner similar to that described above with reference to FIG. 1 of the drawings. The A/D converter 43 feeds an address to the look-up table which feeds corresponding data to the D/A converter 45.

In order to compensate for the temperature dependence of the VCXO 41 the required data must be loaded into the memory 44. This is done during "calibration mode", wherein a frequency reference 47 is fed to a frequency processor and discriminator 48, an output of which is fed to the logic and control unit 46. In "calibration mode" the frequency processor and discriminator 48 is responsive to the actual frequency generated by the VCXO 41 and to the frequency reference 47 for producing a compensation signal to which the logic and control unit 46 is responsive for programming the temperature compensation look-up table constituted by the non-volatile memory 44.

On the other hand, once the VCXO 41 has been calibrated, thus loading the required data into the non-volatile memory 44, there is no longer any requirement to connect the frequency reference 47 to the frequency processor and discriminator 48. That is to say, that when the digital temperature-controlled crystal oscillator 40 is in normal running mode (corresponding to "compensation mode"), the correct voltage control value is read from the non-volatile memory 44 (corresponding to the look-up table) corresponding to the measured ambient temperature and this is fed, after conversion to an equivalent analog voltage signal to the voltage control crystal oscillator 41. Thus, in the "compensation mode", that part of the logic and control unit 46 relating to "calibration mode" only as well as the frequency processor and discriminator 48 remain inoperative.

In accordance with a first embodiment of the invention, the frequency reference 47 is identical to the desired frequency and is coupled to the logic and control unit 46 via a signal detector 49. The signal detector 49 detects the presence of the frequency reference 47 connected thereto so as to set "calibration mode" and enables the logic and control unit 46 for feeding the required data to the correct address in the non-volatile memory 44 as derived by the A/D converter 43 in respect to the ambient temperature measured by the temperature sensor 42. Alternatively, the signal detector 49 detects the absence of the frequency reference 47 for setting "compensation mode" wherein that part of the logic and control unit 46 as well as the remaining circuitry relating to "calibration mode" only remains disabled.

If desired, the signal detector 49 can be dispensed with altogether and a separate external control signal can be fed to the logic and control unit 46 so as to disable "calibration mode" when "compensation mode" is required.

Figure 5:
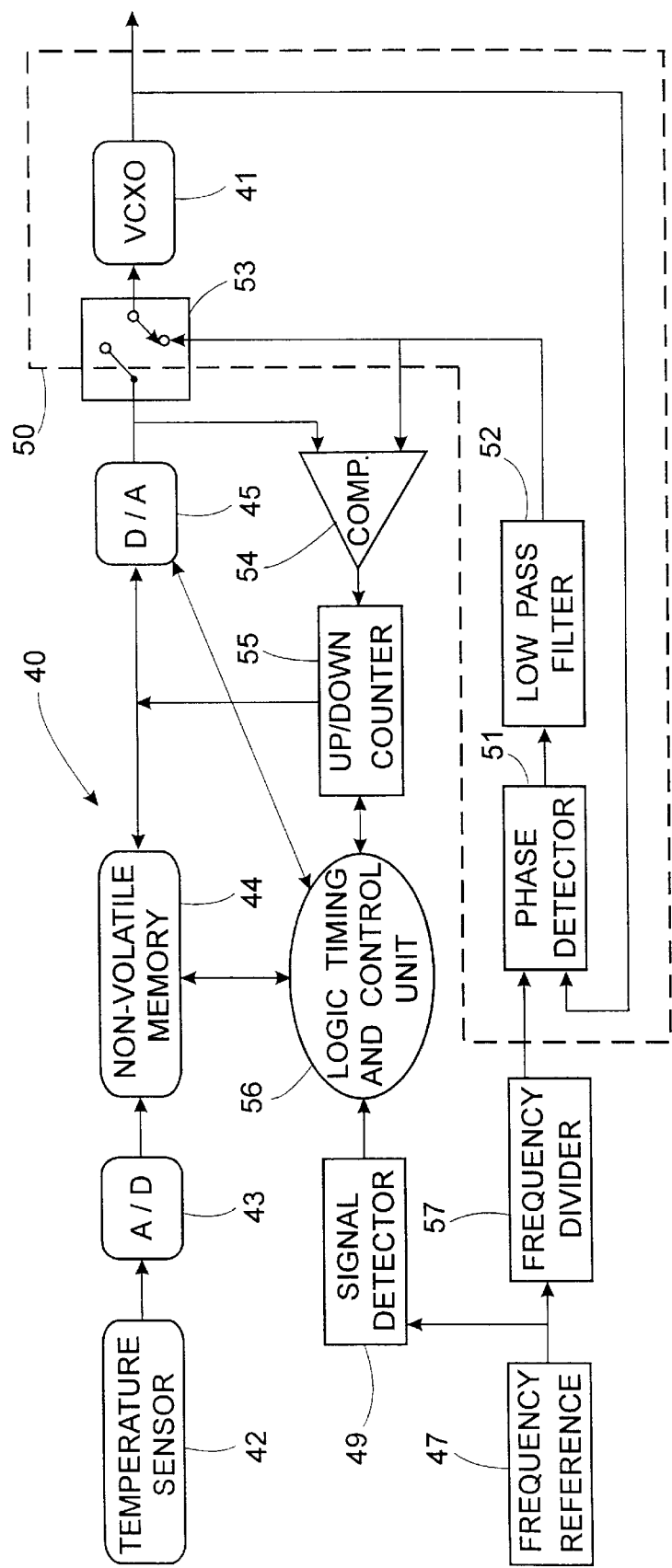
FIG. 5 is a block diagram showing functionally a preferred embodiment of the system shown schematically in FIG. 4.

FIG. 5 shows a functional implementation during "calibration mode" of the system 40 described above with reference to FIG. 4. Calibration is based on the use of a phase locked loop 50 comprising the VCXO 41 to whose input is connected a phase detector 51 via a low pass filter 52. An output of the VCXO 41 is fed back to one input of the phase detector 51 whilst the frequency reference 47 is fed to the other input thereof. The phase-locked loop 50 thus ensures that the voltage fed to the VCXO 41 is of the correct value for locking the output frequency of the VCXO 41 to the frequency reference 47. This voltage is compared by means of a comparator 54 with the analog voltage derived by the D/A converter 45 and which is equivalent to the voltage which would be fed to the VCXO 41 based on the correction factor stored in the non-volatile memory 44 in respect to the ambient temperature measured by the temperature sensor 42. When the system 40 is in calibration mode, a selector switch 53 automatically connects the input of the VCXO 41 to the comparator 54, puts the non-volatile memory 44 in write mode and in addition disconnects the memory 44 from the D/A converter 45 and connects the output of an up/down counter 55 thereto instead. When the system 40 is in compensation mode, the selector switch 53 connects the input of the VCXO 41 to the D/A Converter 45, disconnects the up-down counter 55 from the D/A converter 45 and connects the data bus of the non-volatile memory 44 thereto instead. A logic timing and control unit 56 is responsively coupled to the signal detector 49 and to the non-volatile memory 44, the D/A converter 45 and the up/down counter 55 for connecting an output of the up/down counter 55 to the non-volatile memory 44 and to the D/A converter 45 when the system 40 is in calibration mode. When the system 40 is in compensation mode, the data bus of the non-volatile memory 44 is directly connected to the D/A converter 45 whilst the up/down counter 55 is effectively disconnected from either.

It will be understood that when the system 40 is calibrated for the first time the data stored in the non-volatile memory 44 will either be pre-initialized to an arbitrary value or will have arbitrary random values. However, the initial values are unimportant because, during calibration mode, data is written to the memory 44 thus overwriting previous data. In this mode, under control of the logic timing and control unit 56, the data bus of the non-volatile memory 44 is disconnected from the input of the D/A converter 45 and connected instead to the output of the up/down counter 55 which is also connected to an input of the D/A converter 45. The contents of the up/down counter 55 are converted to an equivalent analog voltage by the D/A converter 45 and fed to the comparator 54 and compared with the exact voltage signal which is required and whose value (or a function thereof) must be stored in the non-volatile memory 44.

The output from the comparator 54 thus represents the sign of the difference, either positive or negative, between the desired voltage as produced by the phase-locked loop 50 and the actual voltage currently stored in the up-down counter 55. This difference is fed back to the up-down counter 55 which increments or decrements the value of the digital compensation voltage, this cycle being repeated until the contents of the up/down counter 55 are stable within 1 LSB. Thus, the D/A converter 45 together with the comparator 54 and the up/down counter 55 function as an A/D converter for converting the analog control voltage fed to the VCXO 41 to a digital control value. The value then output by the up/down counter is now stored in the non-volatile memory 44, which operates in write mode during calibration mode, in an address corresponding to the ambient temperature under control of the logic timing and control unit 56. At this point, the voltage produced by the D/A converter 45 corresponding to the voltage compensation value now stored in the non-volatile memory 44 in respect of the ambient temperature is exactly equal (to within 1 LSB) to the voltage required to produce the desired frequency. This process may then be repeated in respect of other temperatures, where the respective compensation values are stored in the corresponding memory locations.

From the foregoing description it will be appreciated that no temperature stabilization is required since the actual calibration is always carried out in respect of the ambient temperature as measured by the temperature sensor 42. Even is this is subject to minor fluctuation for any reason, this in no way impairs the accuracy of the calibration procedure since the voltage compensation value which is fed to the non-volatile memory 44 will always be the correct value for the ambient temperature at the moment that it is actually stored in the non-volatile memory 44 under control of the logic timing control unit 56.

For the sake of completeness, it is to be noted that the signal detector 49 is responsive to a signal produced by the frequency reference 47 for enabling the logic timing control unit 56 for "calibration mode" only when the frequency reference 47 is coupled to the system 40. Thus, if desired, all of the components apart from the frequency reference may remain connected to the VCXO 41 since only when the frequency reference 47 is connected and detected by the signal detector 49 will be calibration process be initiated. Alternatively, instead of the signal detector 49, the logic timing control unit 56 may contain a selector switch which is responsive to an external signal so as to initiate the calibration-specific components of the logic timing control unit 56 in "calibration mode" only when it is required to calibrate the non-volatile memory 44.

If desired, a frequency divider 57 (constituting a frequency matching means which is active in calibration mode only) may be disposed between the frequency reference 47 and the phase lock loop 50 in order that the frequency output by the VCXO 41 may be a desired fraction of the frequency reference 47. In this manner, a plurality of frequency dividers 57 may be employed for simultaneously calibrating a like plurality of different VCXOs 41 each having a different destination frequency which is a specific fraction of the frequency reference 47. Alternatively, when no frequency matching means 57 are provided, then it is necessary to provide a frequency reference 47 which is exactly equal to the desired frequency of the crystal oscillator; and, moreover, simultaneous calibration in the same temperature-controlled oven using a single wire for connecting the frequency source to each oscillator is possible only in respect of a batch of crystal oscillators all having the same output frequency.

Figure 6:
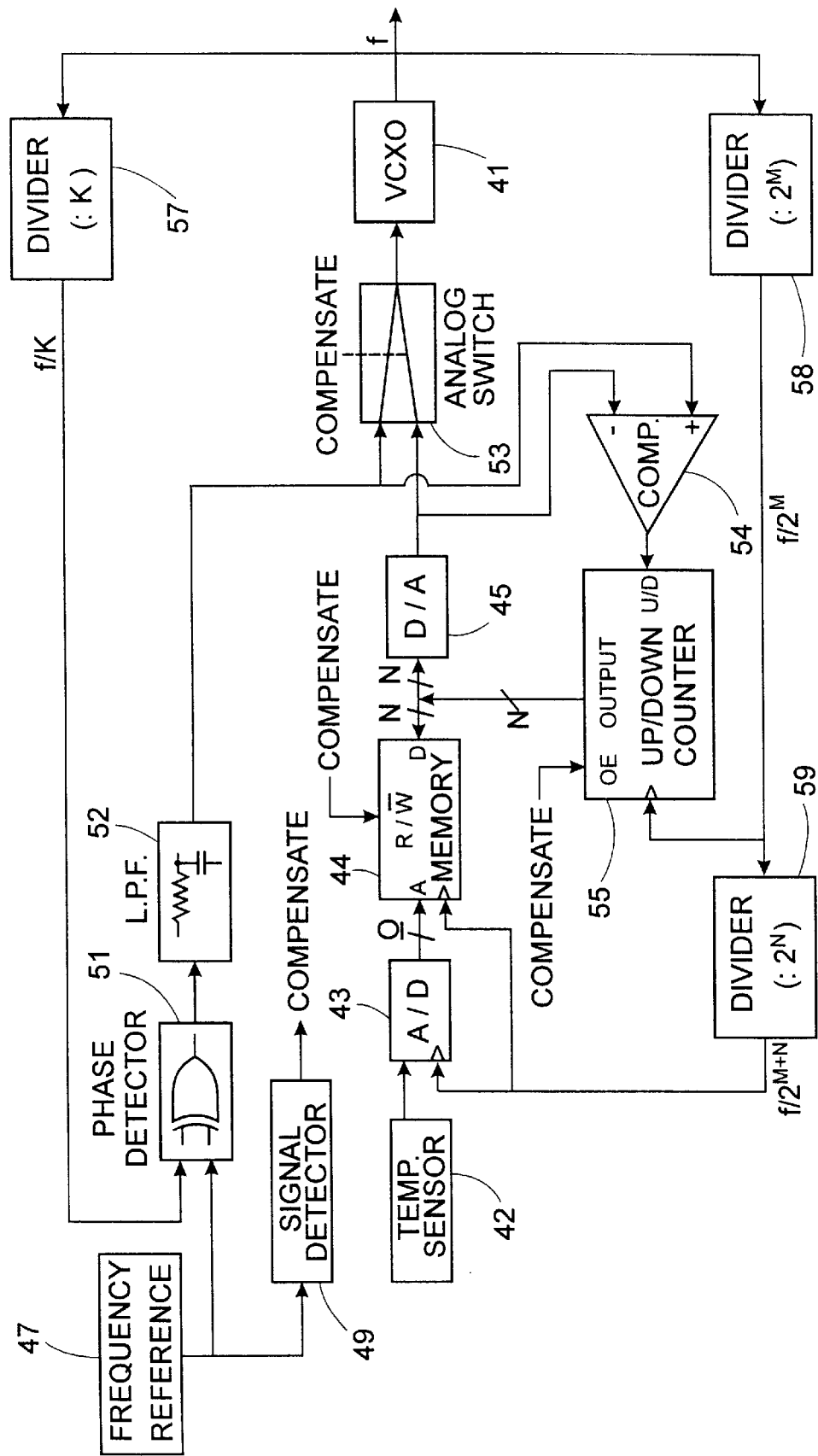
FIG. 6 is a schematic diagram illustrating timing, logic and control functions associated with the system shown functionally in FIG. 5.

FIG. 6 shows a specific implementation of the control and timing for the system 40 described above functionally with reference to FIG. 5 of the drawings. Thus, the reference signal derived by the frequency reference 47 is fed to the signal detector 49 which produces wither a "COMPENSATE" or a complementary "CALIBRATION" signal according to whether the frequency reference 47 is connected to the signal detector 49 or not. Likewise, the frequency reference 47 is connected to one input of the phase detector 51 whose other input is connected, via the frequency divider 57, to the output of the VCXO 41. The implementation of the phase detector 49 is based on an XOR gate whilst the low pass filter 52 is based on an RC network. The selector switch 53 is shown as an analog switch which is responsive to the "COMPENSATE" signal derived by the signal detector 49 for connecting the output of the D/A converter 45 to the input of the VCXO 41; and being responsive to the "CALIBRATION" signal produced by the signal detector 49 (in the absence of the frequency reference 47 being connected thereto) for connecting the output of the low pass filter 52 to the input of the VCXO 41. The phase detector 51, the low pass filter 52, the selector switch 53, the VCXO 41 and the frequency divider 57 together constitute the phase lock loop 50 functionally shown in FIG. 5.

In order to provide correct clock signals for the up/down counter 55, a $2^M$ divider 58 connects the output frequency of the VCXO 41 to a clock input of the up/down counter 55; whilst a $2^N$ frequency divider 59, connected in cascade with the $2^M$ frequency divider 58 feeds a reduced frequency signal to respective clock inputs of both the A/D converter 43 and the non-volatile memory 44.

In such an arrangement, assuming that the output frequency generated by the VCXO 41 be denoted by f, then the clock signal fed to the up/down counter 55 has a frequency of $fl(2^M)$ whilst the clock signal fed to the A/D converter 43 as well as to the non-volatile memory 44 has a frequency of $fl(2^{M+N})$.

It is to be noted that in the particular implementation shown in FIG. 6, the frequency divider 57 (constituting the frequency matching means) is contained within the circuit connected to the output of the VCXO 41, thereby allowing the frequency reference 47 to be connected to a batch of VCXOs 41 of the kind described via a single serial connection without the need for interposing frequency dividers in the event that some of the crystal oscillators operate at different multiples of the frequency reference and allowing the reference frequency to be an exact division of the VCXO frequency. The $2^M$ and $2^N$ frequency dividers 58 and 59, respectively, merely serve the purpose of providing clock signals and exploit the highly accurate frequency reference provided by the VCXO 41. It will be appreciated that, if desired, suitable clock signals could be derived via an independent frequency reference.

In calibration mode, the comparator 54 allows the analog voltage applied to the control terminal of the VCXO 41 within the phase lock loop 50 to be compared to the analog voltage produced by the D/A converter 45 and produce a respective digital output which is HIGH (logic "1") if the output voltage from the low pass filter 52 is higher than that of the D/A converter 45 and is LOW (logic "0") otherwise. Thus, when the output of the comparator 54 goes HIGH, the output of the up/down counter 55 is incremented by one at each clock pulse and is decremented by one otherwise. Hence, a loop consisting of the comparator 54, the up/down counter 55 and D/A converter 45 is implemented, locking the output of the D/A converter 45 to the output of the low pass filter 52. Neglecting other inaccuracies in the circuits (e.g. comparator input offset, analog switch voltage drop etc.), after a large number of clock pulses has elapsed, the output of the D/A converter 45 will track the input of the VCXO 41 to within the LSB value of the D/A converter 45. The accuracy of the compensation, represented by the LSB value of the D/A converter 45, is thus a function of the number of input lines N thereof. The division ratio of the clock 59 and the number of output lines of the up/down counter 55 are selected in accordance therewith so as to ensure that the up/down counter 55 is stabilized for each different address of the non-volatile memory 44. The number of memory address lines (bits) O and data lines N determine the accuracy of the network.

In practice, it is desirable that the temperature sensor 42 be located as close as possible to the VCXO 41, in order to minimize any difference in the temperatures thereof. The temperature signal derived by the temperature sensor 42 is digitized by the A/D converter 43 and serves as an address to the look-up table within the non-volatile memory 44. The output of the up/down counter 55 is fed to the D input of the non-volatile memory 44 and the "COMPENSATE" signal is connected to the W/R (Write/Read) input of the non-volatile memory, setting the memory to "WRITE" mode. As such, the value output of the up/down counter 55 is written to the non-volatile memory 44 in the address set according to the measured temperature value. The writing process is timed by clock signals derived from the frequency dividers 58 and 59 which ensure that the value produced by the up/down counter 55 is stable within ±1 LSB at each memory write cycle.

The writing cycle period of the non-volatile memory 44 is designed to be much shorter than the temperature range which results in a change in the output of the A/D converter 43. This ensures that when the unit is put into an environment which sweeps over the required temperature range, all addresses in the non-volatile memory 44 will be written to. As such, when the system is put into an oven or temperature chamber which sweeps over the complete temperature range, frequency reference 47 being connected to the signal detector 49, at the end of the calibration process, the look up table within the non-volatile memory 44 will be filled with the respective voltage values corresponding to each discrete temperature value.

Compensation mode is operative when the frequency-reference 47 is not connected to the signal detector 49 such that the latter produces "COMPENSATE" signal (logic "0"), the analog switch 53 connects the output of the D/A converter 45 directly to the input of the VCXO 41. Additionally, the OE (Output Enable) input of the up/down counter 55 also goes LOW as does the W/R input of the non-volatile memory 44. Under these conditions, the up/down counter 55 is disabled and the non-volatile memory 44 is write-protected in "READ" mode. As such, regular operation of the digital temperature-controlled crystal oscillator is resumed.

The invention has been described thus far with regard to temperature compensation and calibration only. However, the principles of the invention are also applicable to aging compensation of electronic devices whose output drifts from a desired value with age. For example, in the case of crystal oscillators, not only is their output frequency temperature dependent, but the temperature-frequency dependency itself drifts owing to aging of the crystal oscillator.

The most accurate aging compensation is effected by re-calibrating the VCXO 41 over its complete operating temperature range. This automatically corrects for non-linearities in the voltage correction which must be applied in order to provide a constant temperature drift over the complete operating range. As noted above, although the frequency drift is constant over the operating temperature range, owing to aging of the crystal the actual difference in the voltage value which must be fed to the VCXO 41 is itself not constant owing to non-linearities in the voltage-frequency dependence. Thus, if it be desired to provide full correction which also takes this non-linearity into account, then there is no alternative but to re-calibrate the non-volatile memory 44 in its entirety.

Figure 7:
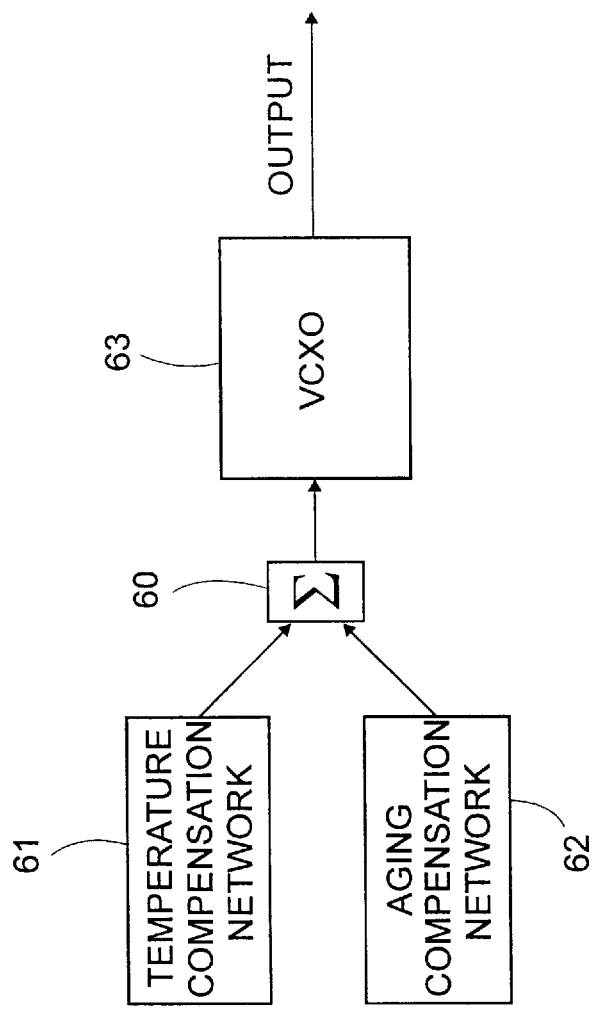
FIG. 7 shows schematically a crystal oscillator including integral compensation for both temperature and aging.

Reference is now made to FIG. 7 which shows schematically a VCXO 63 having temperature and aging compensation provided by a respective temperature compensation network 61 and an aging compensation network 62 whose respective outputs are fed to the VCXO 63 via a summer 60. Alternatively, both the temperature and aging compensation networks 61 and 62, respectively, could produce digital outputs for feeding to a conventional digital adder. There will now be described with reference to FIGS. 8a and 8b of the drawings, different embodiments for carrying out such aging compensation: first in the case that temperature compensation is provided discretely and independent of the aging compensation; and secondly in the case wherein temperature compensation is provided according to the invention and the aging compensation is combined therewith.

Figure 8A:
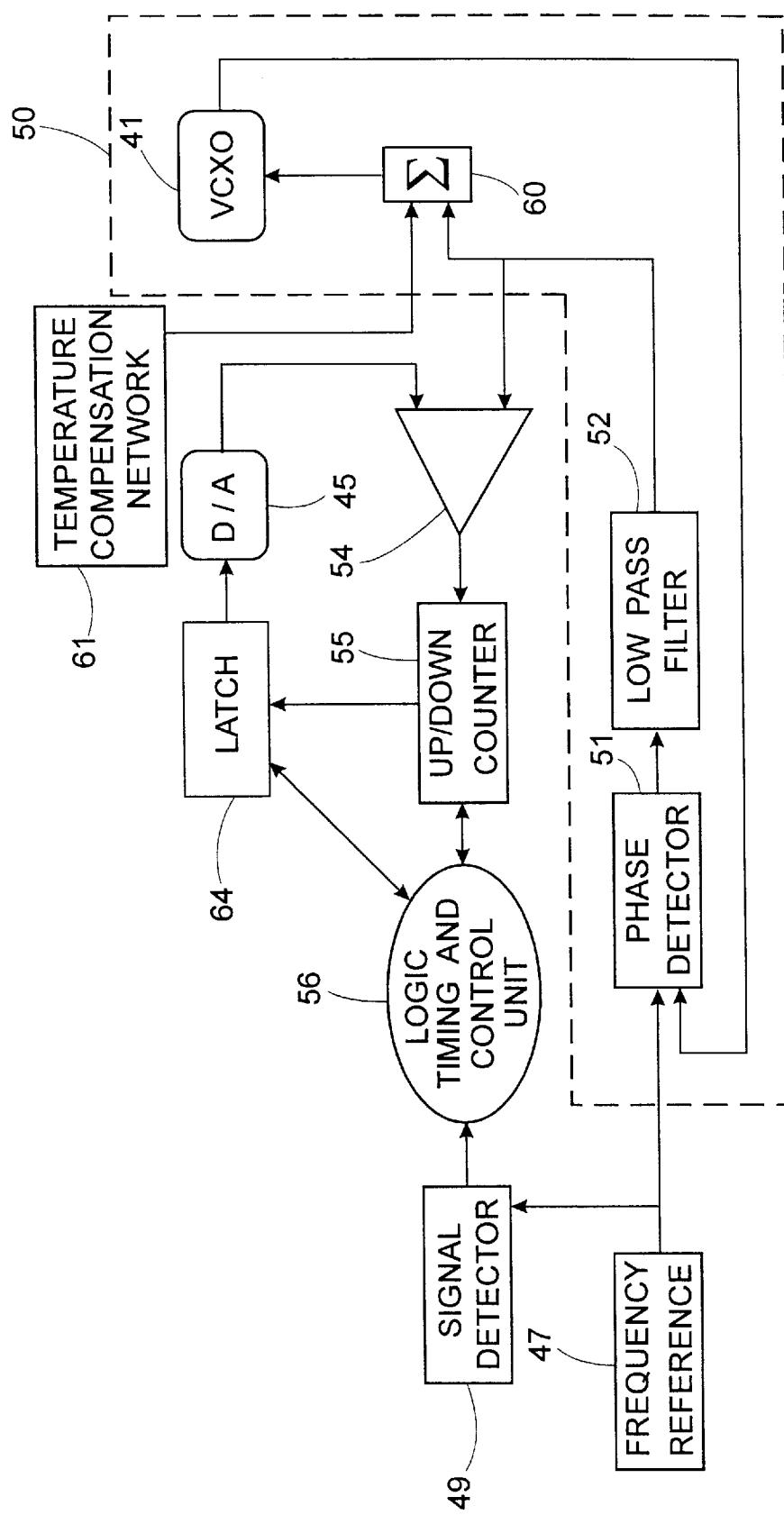
FIG. 8a is a schematic diagram of a calibration system for allowing aging compensation according to the invention to be added to a crystal oscillator already having temperature compensation.

Thus, referring to FIG. 8a, there is shown a system for effecting compensation of aging drift of a VCXO 41 having an independent temperature compensation network 61. The system is similar in respect of most of its components to the temperature compensation system described above with reference to FIG. 5. Thus, the interconnection of the frequency reference 47, the signal detector 49, the logic timing and control unit 56 and the output of the phase lock loop 50 is as shown in FIG. 5. However, the up/down counter 55 is connected to the input of the D/A converter 45 via a latch 64 which, under control of the logic timing and control unit 56, stores the last value of the up/down counter 55. Thus the D/A converter 45 in conjunction with the comparator 54 and the up/down counter 55 together function as an A/D converter for deriving the digital value which must be added to the temperature compensation signal. The output of the VCXO 41 is fed back to the phase detector 51 within the phase lock loop 50. However, the control voltage produced by the phase lock loop 50 relates only to the aging offset added to the output of the temperature compensation network 61 which is not part of the phase lock loop 50. This aging offset voltage is fed to one input of the comparator 54 to whose other input is fed the output of the D/A converter 45. The phase lock loop 50 thus ensures that the correct aging offset voltage is fed to the summer 60 so that the VCXO 41 produces an output frequency equal to that of the frequency reference 47.

Such a system operates as follows. The temperature compensation network operates independently to feed an analog control voltage to the VCXO 41 via the summer 60. Prior to aging calibration, the value stored in the up/down counter 55 and hence in the latch 64 may be zero or a mid-span value or any other arbitrary digital value. During aging calibration, the value of the aging offset voltage fed to the latch 64 is transparent and converted to an equivalent analog signal by the D/A converter 45, and then fed to one input of the comparator 54 to whose other input is fed the control voltage produced by the phase lock loop 50. Upon stabilization, the up/down counter 55 hunts for the correct digital value whose equivalent analog voltage must be added by the summer 60 to the temperature compensation control voltage in order to calibrate the output frequency of the VCXO 41 to the frequency reference 47 for the current ambient temperature. The aging calibration can be performed at any non-specific temperature. At the end of the aging calibration process, the latch 46 is latched again, and its latched value is used for the whole temperature range during "compensation mode".

Figure 8B:
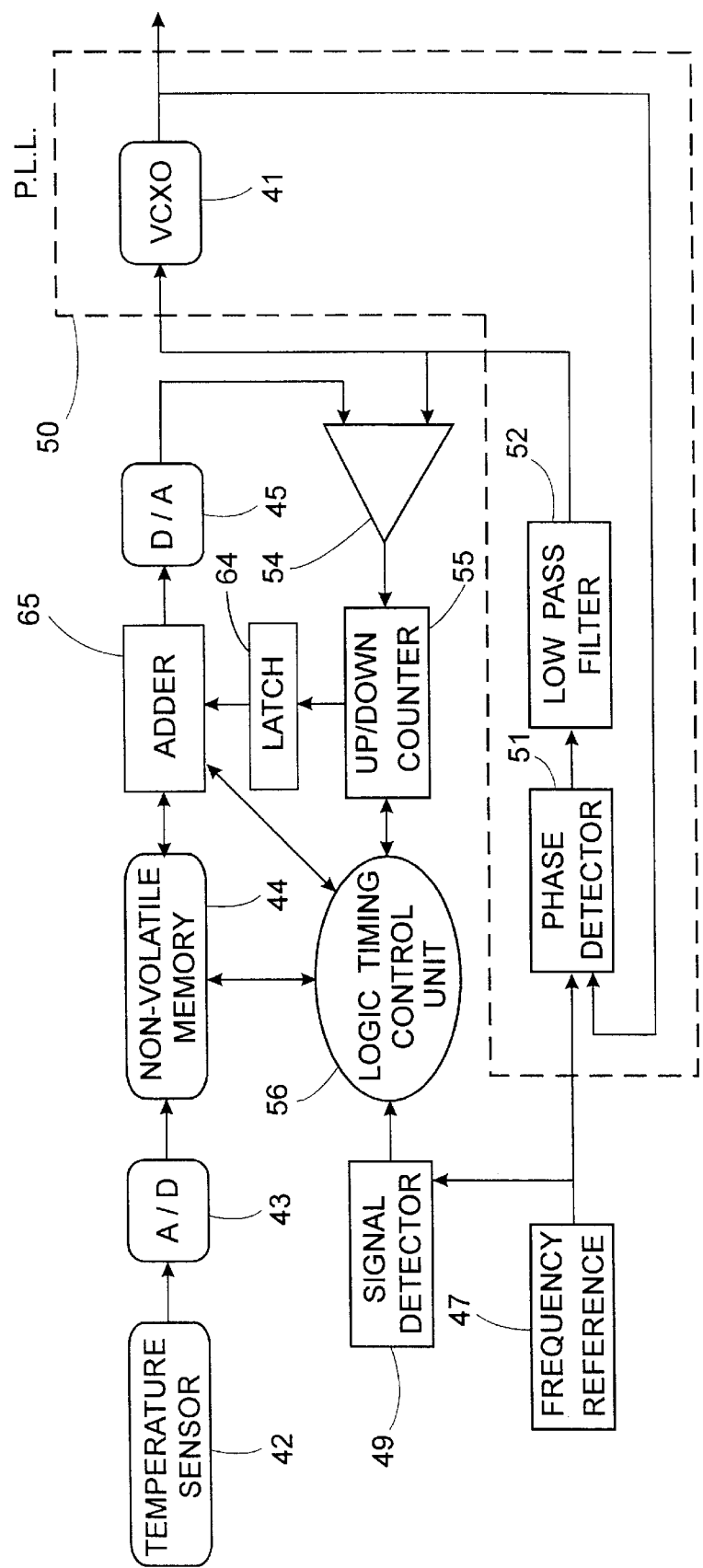
FIG. 8b is a schematic diagram of a calibration system for a crystal oscillator allowing both temperature and aging compensation to be achieved using shared circuit components in a system according to the invention.

FIG. 8b shows an alternative embodiment of a calibration system wherein temperature and aging compensation are combined in an integrated system. The system shown in FIG. 8b requires a slight modification to the systems shown in FIG. 5 and FIG. 8a. By using the appropriate logic, control and switching elements, the system can be configured to implement a temperature or aging calibration system, as described in FIGS. 5 and 8a, respectively. Most of the calibration-specific components (e.g. phase detector 51, low pass filter 52, comparator 54, up/down counter 55 and signal detector 49) are used for both applications. As such, major savings are achieved in the hardware required resulting in reduced size and cost.

An output of the up/down counter 55 is fed to a latch 64 an output of which is fed to an adder 65 disposed between the non-volatile memory 44 and the D/A converter 45. The non-volatile memory 44 under control of the logic timing control unit 56 is also responsively coupled to the adder 65 in order that the value actually stored in the non-volatile memory 44 may be a function of the instantaneous value in the up/down counter 55 as well as a fixed correction value stored in the latch 64.

The system shown in FIG. 8b may be used in several ways as will now be described.

The temperature calibration described above can also be used to calibrate for aging by periodically re-calibrating across the complete temperature range thus avoiding inaccuracies due to the slight non-linearities ("Trim Effect"). If desired, this can be done as part of the production process wherein, in effect, no aging compensation is required. In this case, the latch 64 is transparent and the adder 65 is inactive, thus reducing the system to the embodiment described above with reference to FIG. 5 of the drawings.

Alternatively, in those cases where the slight non-linearities may be accepted, the system may be run for aging calibration in a manner similar to that described above with reference to FIGS. 5 and 8a such that the up/down counter 54 is either incremented or decremented, as required, until the voltage output by the D/A converter 45 is equal to the voltage fed to the VCXO 41 under control of the phase lock loop 50. This value may now be stored in the latch 64 without effecting any correction to the value stored in the non-volatile memory 44. Thereafter, in actual use of the system in compensation mode, the temperature compensation value stored in the non-volatile memory 44 for a specific ambient temperature is added to the aging compensation value stored in the latch 64 before being converted to an analog signal by the D/A converter 45. By such means, a constant aging compensation correction can be added to each value in the non-volatile memory 44.

It is also possible that the non-volatile memory 44 may contain a plurality of look-up tables each corresponding to a different frequency deviation and to provide computing means for computing the correct frequency deviation for compensating for a current aging offset. In this case, access to the appropriate look-up table within the non-volatile memory 44 is achieved via the computing means which is responsive to the aging compensation value stored in the latch 64. Alternatively, the voltage fed to the VCXO 41 via the D/A converter 45 may be a function of the instantaneous value stored in the non-volatile memory 44 for the current ambient temperature and the value stored in the latch 64 after suitable processing by a processing unit replacing the adder 65.

If appropriate, the aging compensation value stored in the latch 64 may be used in order to compute the temperature compensation voltage corresponding to the measured ambient temperature in those cases where discrete voltage control values are not stored in the memory but, rather, a voltage-temperature relationship is stored therein. In such case, the value stored in the latch 64 together with the values stored in the non-volatile memory 44 may be processed by the computing means to yield a new memory content which will then be used subsequently. For example, the value stored in the latch 64 may be used as a parameter of a function which is used to process the memory values.

Figure 9:
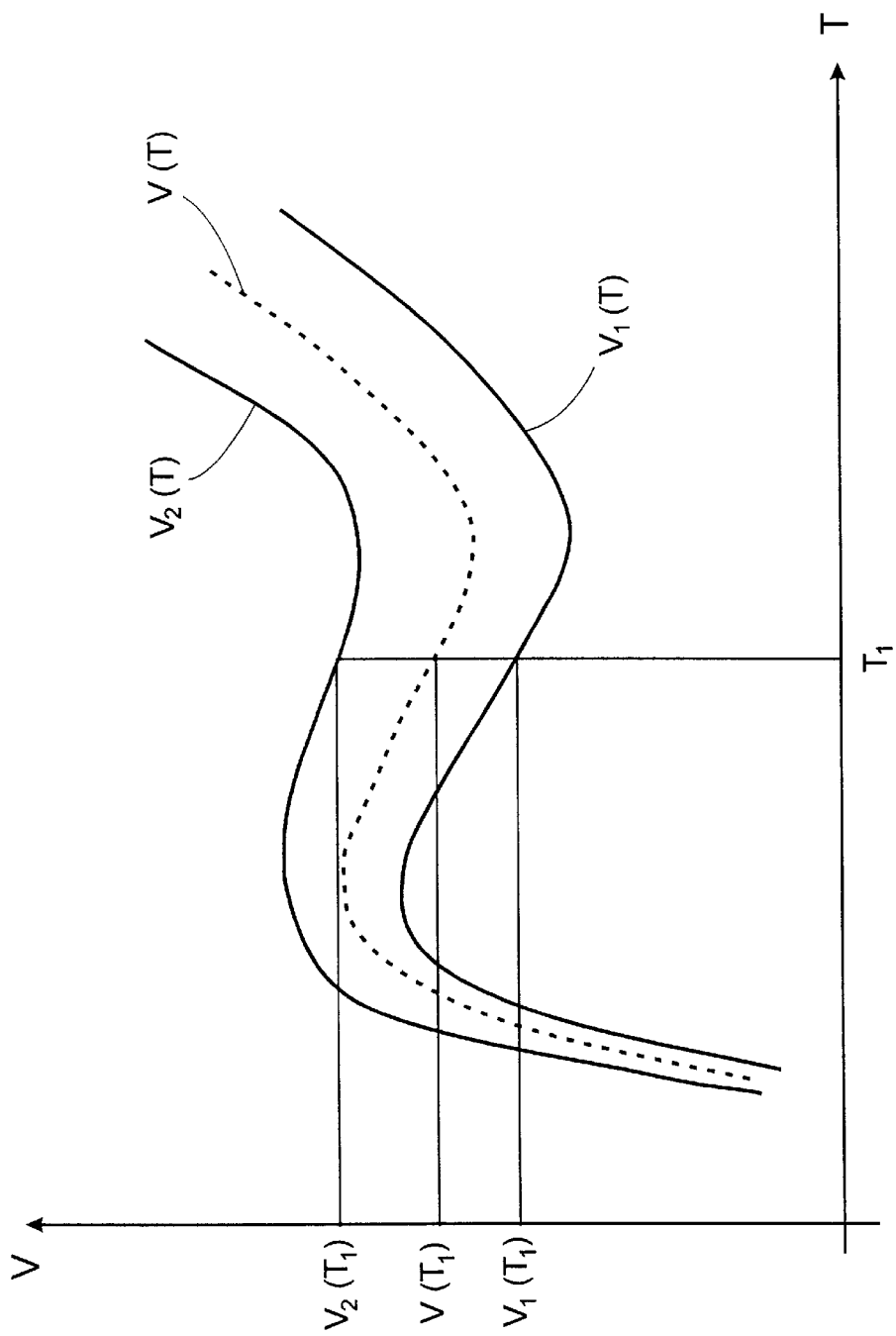
FIG. 9 shows a graph relating to a method for correcting for voltage-frequency trim effect using the invention.

Such an approach may be used to compensate for "trim effect" to which reference has already been made. FIG. 9 shows a pair of pre-calibrated voltage-temperature curves $V_1(T)$ and $V_2(T)$ corresponding to respective constant frequency drifts $\Delta f_1$ and $\Delta f_2$ and a third characteristic $V(T)$ corresponding to an intermediate frequency drift $\Delta f$ which itself is not calibrated but is to be interpolated or extrapolated from $V_1(T)$ and $V_2(T)$. Assume further that $\Delta f_1$ equals zero so that $V_1(T)$ represents the voltage control values relating to the desired output frequency at 0 ppm deviation during manufacture. When aging calibration is performed at a temperature $T_1$, a specific control voltage $V(T_1)$ is measured at an ambient temperature $T_1$ and the aging and temperature compensation control voltages $V(T)$ may then be extrapolated for the whole range according to:

$$V(T) = V_1(T) + \left( \frac{V(T_1) - V_1(T_1)}{V_2(T_1) - V_1(T_1)} \right) \cdot [V_2(T) - V_1(T)]$$

$$\text{denoting: } \rho = \left( \frac{V(T_1) - V_1(T_1)}{V_2(T_1) - V_1(T_1)} \right) \text{ yields}$$

$$V(T) = V_1(T) + \rho \cdot [V_2(T) - V_1(T)]$$
$$= (1 - \rho) \cdot V_1(T) + \rho \cdot V_2(T)$$

Thus, if $\rho$ equals 0, then the compensation curve corresponds to $V_1(T)$; whilst if $\rho$ equals 1, then the compensation curve corresponds to $V_2(T)$. During manufacture, the two sets of values $V_1(T)$ and $V_2(T)$ are stored, corresponding to two different output frequencies. The difference between the frequencies should be in the order of magnitude of the expected unit aging (e.g. 5 ppm for 1 ppm/year aging rate). The absolute frequencies should be close to the nominal output frequency. For the sake of explanation, suppose that $V_1(T)$ represent the values for the exact nominal frequency required (i.e. 0 ppm deviation corresponding to $\rho=0$). As such, the $V_1(T)$ values will be solely used from production until the first aging calibration is performed. Similarly, other reference frequencies can be used (e.g. −5 ppm and +7 ppm). In such case, $\rho$ must be calibrated during manufacture and stored in the latch 64 as is done in the subsequent aging calibration.

When an aging calibration is performed, the control voltage is varied so that, at any single temperature $T_1$, the output frequency of the crystal oscillator is equal to the desired frequency. The value of the required control voltage, referred to as $V(T_1)$ is then measured and thereafter determined as the linear combination of $V_1(T_1)$ and $V_2(T_1)$. The function is then stored and extrapolated over the whole temperature range, designated as $V(T)$, and the extrapolated values are then used to effect the required temperature compensation of the crystal oscillator. In the above example, the function $V(T_1)$ is used to calculate $\rho$ based on the values of $V_1(T_1)$ and $V_2(T_1)$. Thereafter, the same value of $\rho$ is applied over the complete temperature range to yield $V(T)$ as a function of $V_1(T)$ and $V_2(T)$. By such means, it is possible to compensate for the "trim-effect" described above, whereby a constant drift in the temperature-frequency characteristics of the crystal oscillator owing to aging must be compensated for by a corresponding shift in voltage which itself is not constant.

Figure 10:
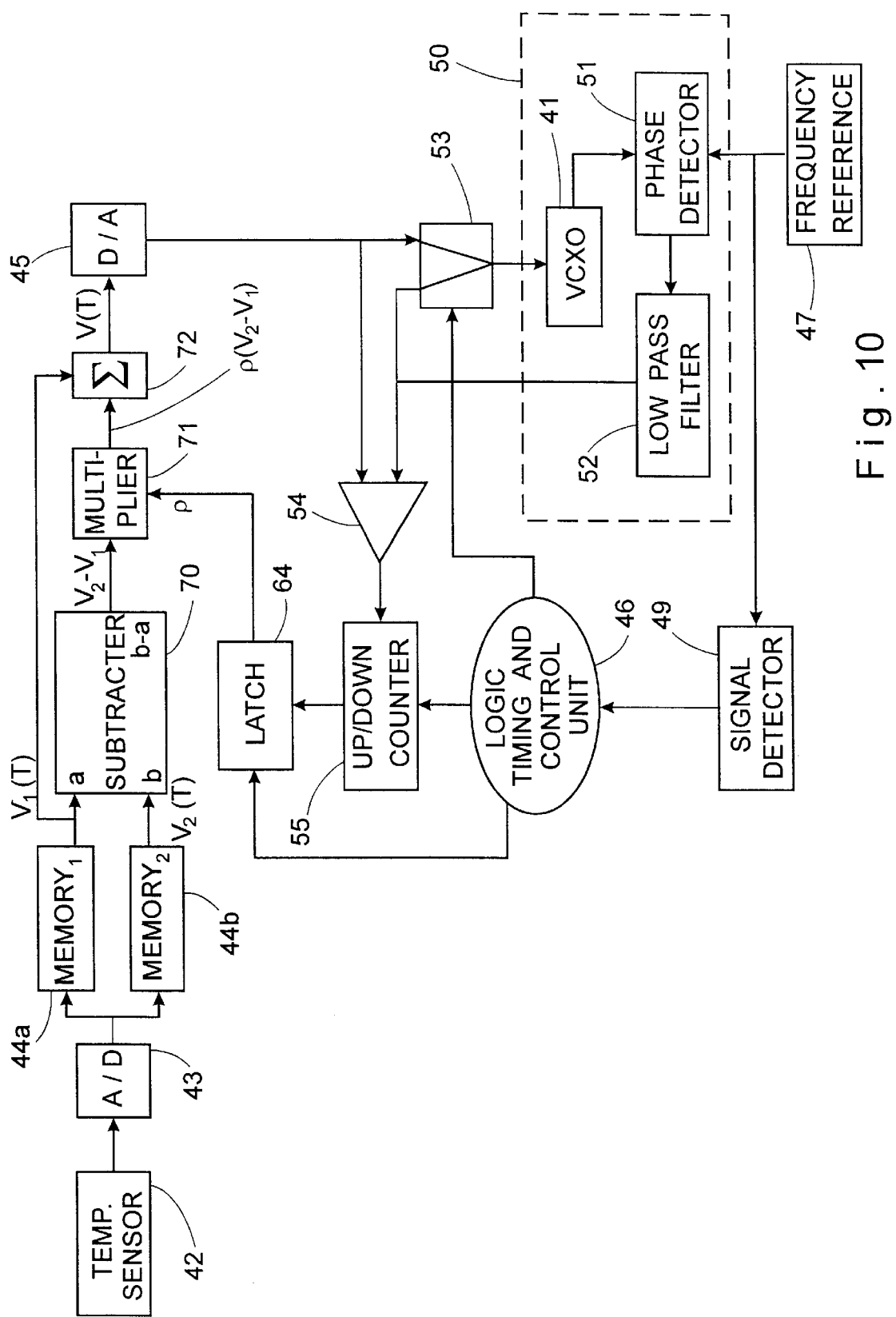
FIG. 10 is a schematic diagram of a system for allowing aging compensation according to the invention of a crystal oscillator having integral temperature compensation corrected for trim effect.

FIG. 10 shows the modifications to the system described above with reference to FIG. 8b for implementing the above-described correction of the "trim-effect". Instead of employing a single non-volatile memory 44, there are now employed two memories 44a and 44b, respective outputs of which are fed to respective inputs a and b of a subtractor 70 whose output is equal to the difference between the values in the second memory 44b and the first memory 44a. The output of the subtractor 70 is fed to one input of a multiplier 71 to whose other input is fed the output of the latch 64. The output of the multiplier 71 together with the output of the first memory 44a are fed to a summer 72 whose output is fed to the D/A converter 45. The interconnection of the remaining components in the system is identical to that already described above with reference to FIG. 5 of the drawings.

The system shown in FIG. 10 operates as follows. During compensation mode, the voltage compensation values $V_1(T)$ and $V_2(T)$ are stored in the memories 44a and 44b. Thus, the output of the subtractor 70 is equal to $V_2(T)-V_1(T)$, i.e. the denominator of the coefficient ρ. The value of ρ itself is stored in the latch 64 such that the output of the multiplier 71 is equal to $\rho \cdot [V(T)-V_1(T)]$ and this is added by the summer 72 to the value $V_1(T)$ stored in the first memory 44a. Thus, the output of the summer 72 is equal to V(T) corresponding to the correct value of the temperature-compensated control voltage after aging compensation is effected. During calibration mode the up/down counter 55 is active and the latch 64 is transparent. When the system stabilizes, ρ is the correct value for the current instantaneous ambient temperature $T_1$. Therefore, when the latch 64 is latched, the correct value of ρ is stored therein.

Whilst the invention has been described with particular reference to temperature compensation of crystal oscillators, it should be noted that the principles of the invention are equally applicable to any external effects affecting the frequency stability thereof and specifically to additional environmental and electrical conditions. The environmental conditions can be vibration, acceleration, altitude etc. and the electrical conditions can be supply voltage, load and so on. In order to accommodate such variations, the embodiments described above must be adapted in the following manner.

The temperature sensor 42 is replaced with any suitable sensor capable of measuring the level of the required external condition in respect of which frequency stabilization is required; the calibration process thus requiring that the device be subjected to various levels of the measured external condition.

For example, consider the case where frequency of a crystal oscillator is to be maintained regardless of applied vibrations. In such case, the calibration process requires that the device be placed on a vibrator and either subjected to different discrete levels of vibration or, alternatively, that the vibrator sweep between lower and upper levels. At the same time, a reference frequency signal is injected so that for each vibration level, the output frequency of the oscillator is locked to the reference frequency.

In a similar manner, the frequency of the crystal oscillator can be maintained regardless of changes in the supply voltage. In such case, the temperature sensor must be replaced by a suitable voltage sensor which is sensitive to variations in the supply voltage. The supply voltage may then be varied whilst applying the reference frequency signal to the device in a similar manner to that described above.

Into the above-mentioned examples, compensation is effected in respect of a single ambient condition only. However, the principles of the invention can easily be extended so that compensation may be effected also in respect of multiple conditions. In such case, compensation for each external condition is performed separately and the resulting correction signals for each compensation run are summed, by either digital or analog means, in a similar manner to that described above with reference to FIG. 7 of the drawings.

Further, whilst the invention has been described with particular reference to a temperature controlled crystal oscillator, it should be noted that the principles of the invention are equally well applicable to any crystal or dielectric oscillator or, indeed, to any frequency source whose output frequency can be configured to be voltage controlled. More generally, the invention can be adapted for use with other electronic devices whose output is temperature dependent and must be stabilized so as to be uniform regardless of variations in ambient temperature. In order to cater for different electronic devices, the frequency reference must be replaced with a reference of the same type as the device output, and the mechanism for learning the correction value will be based not on a phase lock loop but on a different mechanism suited to the specific output type.

Figure 11:
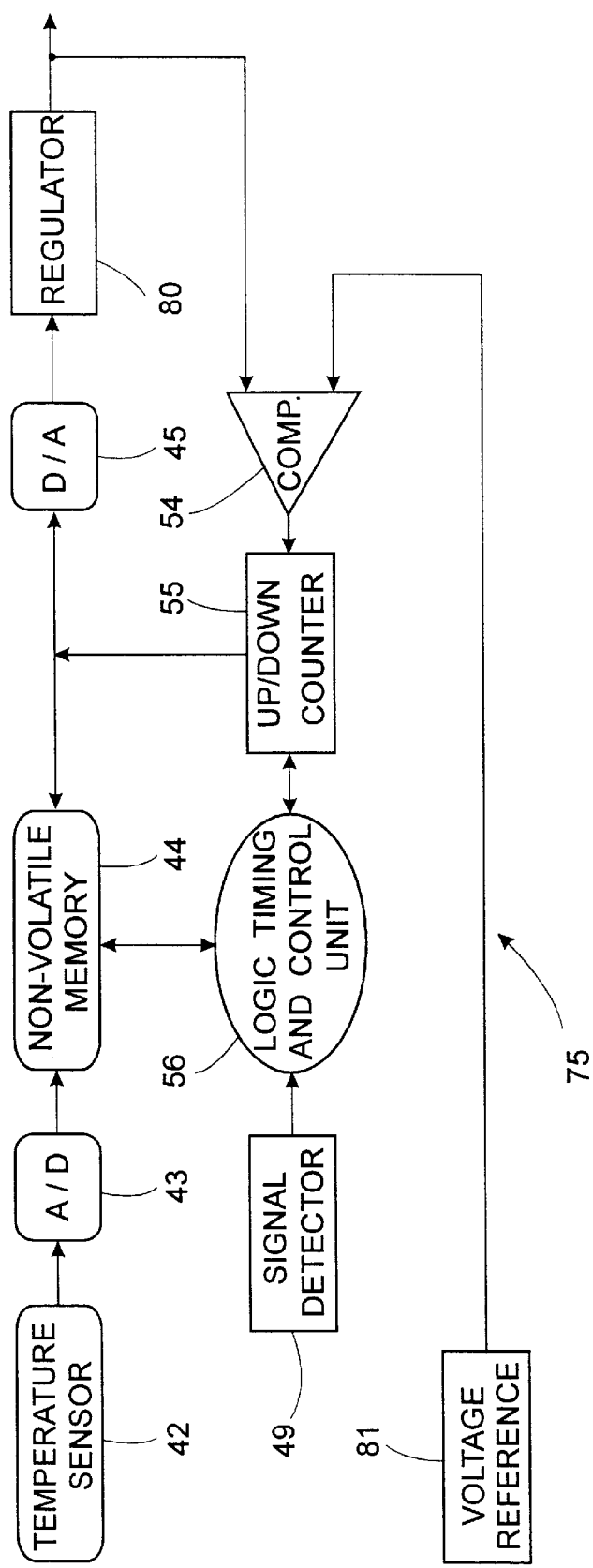
FIG. 11 is a schematic diagram of a system for calibrating a voltage regulator whose output is temperature dependent and must be stabilized so as to be uniform regardless of fluctuations in ambient temperature.

FIG. 11 shows a system 75 for calibrating a voltage regulator 80 whose output is temperature dependent and must be stabilized so as to be uniform regardless of fluctuations in ambient temperature. It will be noted that substantially the same components are used in the system 75 as in previous embodiments except for the omission of the phase lock loop and substitution of a voltage reference 81 for the frequency reference 47 of previous embodiments. The comparator 54 compares the voltage reference 81 with the output voltage of the regulator 80 which is, of course, substituted for the VCXO 41 of the previous embodiments. In compensation mode, the comparator 54 locks the output of the regulator 80, controlled by the D/A converter 45, to the desired reference level associated with the voltage reference 81. All the other circuit functions and compensation mode remain the same as in the previous embodiments. Calibration of the regulator 80 requires injecting the required output voltage level to the regulator (or to a batch of such devices) whilst sweeping the temperature over the relevant temperature range or, alternatively, employing several discrete temperature points and interpolating therebetween.

It is thus apparent that the invention allows for stabilization of a frequency source irrespective of the variations in different types of conditions, both ambient and electrical. Further, the stabilization of any type of electrical signal irrespective of variations in ambient temperature has also been demonstrated. It will be apparent that both approaches can be combined to yield stabilization of any electrical signal irrespective of variations in any condition.

Whilst the invention has been described with particular reference to the use of a voltage control signal for stabilizing an electronic device, the calibration mechanism involving both analog and digital components (analog comparator, counter, A/D converter etc.), it will be understood that the invention is equally well applicable to the use of other control signals, be they analog or digital, for example current, frequency and so on with appropriate modification to the D/A converter 45. In the general case where an analog control signal which is not necessarily a voltage signal is used to control an oscillator, the controlled device will be denoted by the term "Analog Controlled Oscillator" (ACO).

Furthermore, whilst the invention has been described with particular regard to the stabilization of an output signal (such as frequency) in respect of fluctuations in external conditions (such as temperature), it will be appreciated that the invention is equally applicable to the case where the output is to be changed as a predetermined function of a measured external parameter. For example, the principles of the invention allow a digital temperature controlled crystal oscillator to produce different output frequencies according to a desired function of ambient temperature. In such case, the reference frequency can no longer be constant but must be varied in accordance with the required frequency-temperature function. For example, if it be desired that the frequency vary linearly with temperature, then the reference frequency must also be varied so that its value at any given temperature corresponds to the desired linear relationship.

Figure 12:
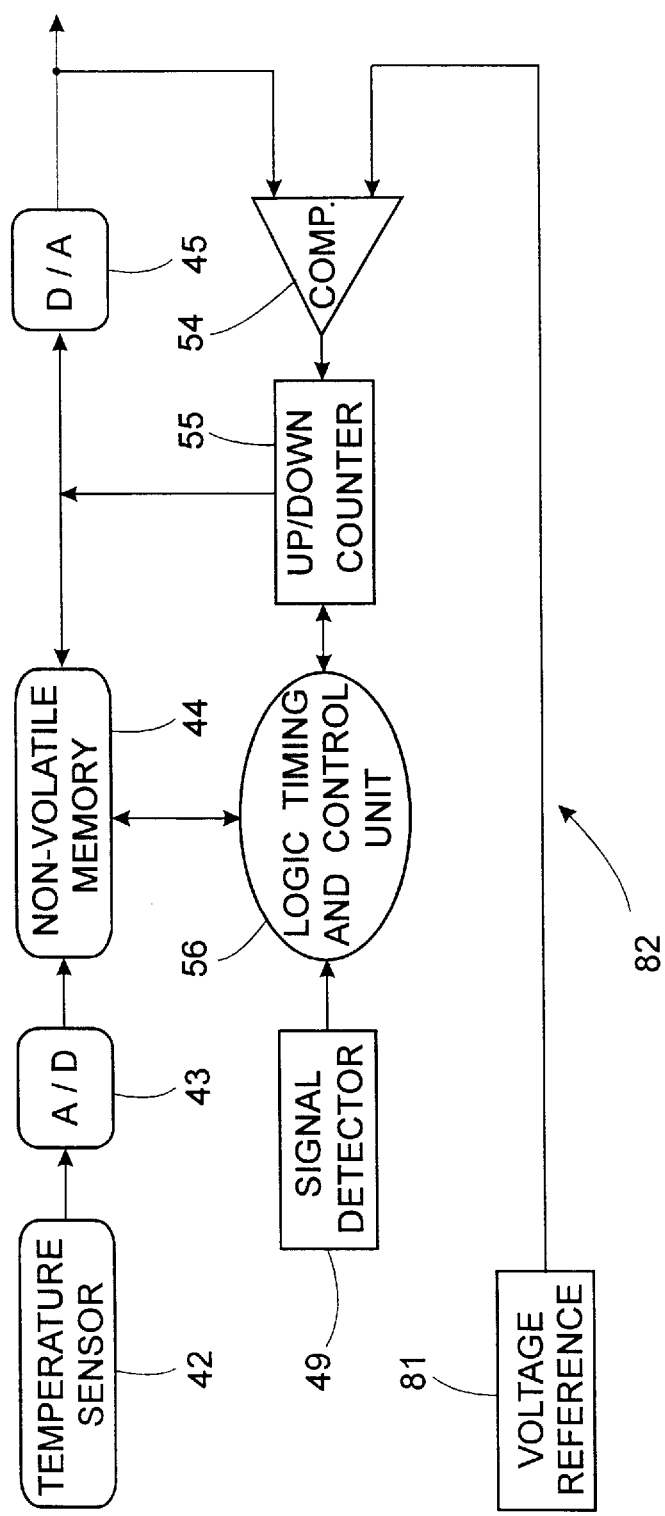
FIG. 12 is a schematic diagram of a system for calibrating a temperature sensor whose output varies according to a known function of temperature.

FIG. 12 shows such an embodiment for a system 82 similar to the system shown in FIG. 11, used for calibrating a linear temperature sensor. Thus, the voltage reference 81 is derived from an accurate linear temperature sensor located in the temperature chamber with the device itself (not shown) so as to be subjected to the same temperature. By such means, it may be guaranteed that the voltage reference 81 provides the correct voltage calibration signal for the instantaneous temperature value of the device. The control values then stored in the non-volatile memory 44 will then be such as to generate the desired linear output voltage versus temperature relationship. The same process can, of course, be applied to sensors other than temperature sensors and to outputs other than voltage or frequency outputs.

It is also to be noted that the calibration-specific components for either temperature or aging, which are not required for compensation, may be implemented by means of separate units which are connected to the oscillator when required; or, alternative, they may be connected wholly or in part to the oscillator. In the event that all of the calibration components are connected in their entirety to the oscillator, this results in a certain redundancy because the temperature compensation calibration components as well as the aging calibration components are only used when the oscillator requires re-calibrating. However, as against this redundancy which adds a small overhead to the overall cost of the oscillator, there is the greatly added convenience of being able to re-calibrate the oscillator in the field without requiring elaborate temperature control and without the end-user losing the use of the device containing the oscillator as would otherwise be the case were it necessary to send the device for service in order to achieve the desired re-calibration.

The same applies when devices other than oscillators are calibrated or their output compensated for to allow for changes in ambient conditions in accordance with the invention.

In the method claims which follow, alphabetic characters used to designate claim steps are provided for convenience only and do not imply any particular order for performing the steps.

I claim:

1. A method for calibrating a batch of at least one device containing a circuit which is responsive to a control signal for producing a desired output which varies in accordance with a first predetermined function of a specific ambient condition, the control signal having a magnitude which varies as a second predetermined function of said specific ambient condition, said second function being based on data stored in a memory of the device and which must be individually calibrated for each device, said method comprising the steps of:
    (a) subjecting all of the devices in the batch to a controlled environment wherein said ambient condition may be varied,
    (b) connecting to the devices an accurate signal source whose output varies in accordance with said second predetermined function of the ambient condition,
    (c) selecting a "calibration mode" of operation wherein said function is determined for a measured ambient condition and the data corresponding thereto is stored in the memory and wherein there are performed the following steps for each device in the batch:
        (i) determining the value of the required control signal for producing an output signal of the desired output magnitude,
        (ii) storing the respective value of the control signal or a function thereof in the memory of each device, and
        (iii) repeating steps (i) and (ii) in respect of different ambient conditions until each value is stored in the memory; and
    (d) selecting a "compensation mode" of operation wherein data is extracted from the memory and used in conjunction with a measured ambient condition for adjusting the control signal.

2. The method according to claim 1, wherein step (c) includes storing in the memory a plurality of said values each in respect of a different measured ambient condition.

3. The method according to claim 1, including the step of compensating for a variation in said ambient condition by:
    (a) measuring the ambient condition,
    (b) extracting from the memory the value corresponding to the measured temperature,
    (c) using the measured ambient condition and said value signal to determine the respective control signal, and
    (d) feeding said control signal to the device.

4. The method according to claim 3, further including the step of compensating for a constant offset in the relationship between the ambient condition and said control signal by:
    (a) storing said offset,
    (b) extracting said offset from the memory,
    (c) adding the offset to the value extracted from the memory in respect of the measured ambient condition so as to derive a corrected value, and
    (d) using the corrected value together with the measured ambient condition to determine the respective control signal.

5. The method according to claim 1, wherein the first predetermined function is a linear function.

6. The method according to claim 5, wherein the first predetermined function is constant regardless of variations in the ambient condition.

7. The method according to claim 5, wherein the frequency is temperature-dependent and the sensor is a temperature sensor.

8. The method according to any one of the preceding claims, wherein the control signal is a voltage-related signal.

9. The method according to claim 1, wherein step (c) is performed continuously whilst sweeping a required range of said ambient condition.

10. A device containing a generator which is responsive to an analog control signal for producing a desired output signal, the control signal having a magnitude varies as a predetermined function of a specified ambient condition, said function being based on data stored in a memory of the device and which must be individually calibrated for each device, said device comprising:
    (a) a selector means for selecting a "generation mode" or "calibration mode" of operation;
    (b) a generating circuit coupled to the selector means for generating during said "generation mode" of operation the desired output signal as a function of the ambient condition, and
    (c) a calibration specific circuit coupled to the selector means for determining and storing said function during said "calibration mode" of operation;
    the generator circuit comprising:
    (d) sensor means for measuring a magnitude of the ambient condition and producing a respective analog sensor signal,
    (e) an A/D converter coupled to the sensor for converting the analog sensor signal to a corresponding digital sensor signal, (f) a memory having at least one memory location for storing therein a respective digital control value, (g) a signal generator having an output whose magnitude can be controlled by an analog control signal, (h) digital processing means responsively coupled to the A/D converter and to the memory and responsive to digital values derived therefrom for producing a digital control signal representative of the analog control signal, and (i) a D/A converter coupled to the digital processing means for converting the digital control signal to the analog control signal;

the calibration specific circuit comprising:

(j) reference signal coupling means for coupling thereto an external reference signal of the same type as the output signal, (k) control means coupled to the reference signal coupling means and to the signal generator for determining the digital value or function thereof which, when processed by the digital processing means in the generator circuit, produces the correct digital control signal for the measured ambient condition, and (l) data entry means coupled to the control means and to the memory for entering said digital value or said function thereof into the memory at said at least one memory location thereof.

11. The device according to claim 10, wherein:

the memory contains a plurality of memory locations each indexed by a respective digital sensor signal and containing a respective digital value, the digital processing means feeds the respective digital value corresponding to a measured ambient condition to the D/A converter, and the data entry means enters said digital value into the memory at the location indexed by the respective digital sensor signal corresponding to the measured ambient condition.

12. The device according to claim 10, wherein the generator circuit is voltage controlled and the analog control signal is a voltage signal.

13. The device according to claim 10, wherein the control means in the calibration specific circuit includes an A/D converter for converting the analog control signal to a digital value for storing in the memory.

14. The device according to claim 13, wherein a single A/D converter is shared by the generator circuit and by the calibration specific circuit and there is further provided a switching means responsively coupled to the selector means for switching the A/D converter between the generator circuit and the calibration specific circuit.

15. The device according to claim 13, wherein the A/D converter includes the D/A converter in the generator circuit.

16. The device according to claim 10, wherein:

the output signal is a frequency, the calibration specific circuit includes a phase lock loop, and the reference signal is a frequency reference having a magnitude equal to m/n times the generator output frequency where m and n are integers.

17. The device according to any one of claims 10 to 16, wherein the sensor is a temperature sensor.

18. The device according to claim 10, wherein the calibration specific circuit is an integral part of the device.

19. The device according to claim 10, wherein the calibration specific circuit is only partially integrated in the device.

20. The device according to claim 10, wherein the selector means includes a coupling means for coupling an external selection signal thereto and is responsive to said external selection signal for selecting the calibration mode or the compensation mode.

21. The device according to claim 10, wherein the selector means is responsive to the reference signal for selecting the "calibration mode" or "generation mode" of operation.

22. The device according to claim 10, wherein the reference signal is an accurate stable signal and in "compensation mode" the output signal of the device is stabilized over a predetermined range of ambient conditions.

23. The device according to claim 10, wherein the reference signal is a linear function of the ambient condition magnitude.

24. A method for calibrating a batch of at least one temperature controlled oscillator (TCO) each containing an analog controlled oscillator (ACO) which is responsive to a control signal for producing a desired output frequency, said control signal having a magnitude which varies as a predetermined function of ambient temperature in order to compensate for temperature variations in the ACO output frequency, said function being based on data stored in a memory of the TCO and which must be individually calibrated for each TCO, said method comprising the steps of:

(a) subjecting all of the TCOs in the batch to a controlled environment wherein said ambient temperature may be varied, (b) connecting a frequency source to the TCOs for producing an accurate frequency, (c) selecting a "calibration mode" of operation wherein said function is determined for a measured ambient temperature and the data corresponding thereto is stored in the memory and wherein there are performed the following steps for each TCO in the batch:

(i) determining the value of the required control signal for producing an output signal of the desired output frequency, (ii) storing the respective value of the control signal or a function thereof in the memory of each device, and (iii) repeating steps (i) and (ii) in respect of different temperatures until each value is stored in the memory; and (d) selecting a "compensation mode" of operation wherein data is extracted from the memory an used in conjunction with a measured ambient temperature for adjusting the control signal.

25. The method according to claim 24, wherein step (c) is effected automatically on connecting the frequency source in step (b).

26. The method according to claim 24, wherein step (c) includes storing in the memory a plurality of said values each in respect of a different measured ambient temperature.

27. The method according to claim 24, wherein the reference frequency is a multiple m/n of the desired frequency where m and n are integers.

28. The method according to claim 24, wherein the TCO is a crystal oscillator.

29. The method according to claim 24, wherein the TCO is a dielectric resonator.

30. The method according to claim 24, wherein step (c) is performed continuously whilst sweeping a required temperature range.

31. A temperature compensated oscillator (TCO) for generating a desired frequency which is stabilized over a predetermined temperature range, said TCO comprising:

a compensation circuit for compensating in compensation mode for changes in temperature in accordance with at least one pre-stored compensation value or a function thereof, a calibration specific circuit active only in calibration mode for determining and storing said at least one compensation value or function thereof, and a selector means coupled to the compensation circuit and to the calibration specific circuit for selecting a corresponding compensation mode or calibration mode of operation;

the compensation circuit comprising:

an analog controlled oscillator (ACO) having an output frequency controllable by an analog control signal $V_c$, a temperature sensor for sensing the ambient temperature of the ACO and producing a corresponding analog signal, an A/D converter coupled to the temperature sensor for converting the analog signal to a corresponding digital temperature value, a memory having at least one memory location for storing therein a respective digital control value, digital processing means coupled to the A/D converter and to the memory and responsive to the respective digital control value and to the digital temperature value for producing a digital signal representative of the analog control signal $V_c$, and a D/A converter coupled to an output of the digital processing means for converting said digital signal to said analog control signal $V_c$;

the calibration specific circuit comprising:

reference signal coupling means for coupling thereto an external signal having an accurate reference frequency, control means coupled to the reference signal coupling means and to the compensation circuit for determining the digital control value which, when processed by the digital processing means in the compensation circuit, produces the control signal $V_c$ corresponding to the measured ambient temperature of the ACO, and data entry means for entering said digital control value into the memory at said at least one location thereof.

32. The TCO according to claim 31, wherein the ACO is a voltage controlled oscillator (VCO) said analog control signal being a voltage signal.

33. The TCO according to claim 31, wherein the memory contains a plurality of memory locations each indexed by a respective one of said digital temperature values for storing therein a respective digital control value, the digital processing means reads said digital control value from the memory and feeds it to the D/A converter, and the data entry means enters said digital control value into the memory at a location thereof corresponding to the digital temperature value representative of the measured ambient temperature.

34. The TCO according to claim 30, wherein the selector means includes a coupling means for coupling an external selection signal thereto and is responsive to said external selection signal for selecting the calibration mode or the compensation mode.

35. The TCO according to claim 34, wherein the external selection signal is constituted by said accurate reference frequency signal.

36. The TCO according to claim 30, wherein the reference signal coupling means includes a frequency matching circuit for matching the reference frequency to the output of the device.

37. The TCO according to claim 36, wherein the control means is based on a phase lock loop for locking the output frequency of the ACO to the reference frequency.

38. The TCO according to claim 30, wherein the control means includes an A/D converter coupled between the memory and the ACO for determining the digital control value or a function thereof.

39. The TCO according to claim 38, wherein the A/D converter utilizes said D/A converter.

40. The TCO according to claim 30, wherein the ACO is a crystal based signal-controlled oscillator.

41. The TCO according to claim 30, wherein the ACO is a dielectric resonator oscillator.

42. The TCO according to claim 30, wherein the calibration-specific circuit is integral to the TCO.

43. The TCO according to claim 30, wherein the calibration-specific circuit is only partially integrated in the TCO.

44. A temperature compensation oscillator (TCO) for generating a desired frequency which is stabilized over a predetermined temperature range, said TCO comprising:

a compensation circuit for compensating for changes in temperature in accordance with a pre-stored compensation function, a dedicated aging calibration circuit for determining the storing at least one value for operating in conjunction with the compensation circuit so as to compensate for aging of the oscillator, and a selector means coupled to the compensation circuit and to the dedicated aging calibration circuit for selecting a corresponding compensation mode or aging calibration mode of operation;

the compensation circuit comprising:

a signal controlled oscillator (ACO) having an output frequency controllable by an analog control signal $V_c$, a temperature sensor for sensing the ambient temperature of the ACO and producing a corresponding analog temperature signal, and a transducer means responsive to the temperature signal for producing the control signal $V_c$;

the aging calibration circuit comprising:

reference signal coupling means for coupling thereto an external signal having an accurate reference frequency, control means coupled to the reference signal coupling means and to the ACO for determining an offset correction value or a function thereof which operates in conjunction with the compensation circuit so as to produce the control signal $V_c$ corresponding to the measured ambient temperature of the ACO, storage means for storing said offset correction value or said function thereof, and offset correction means coupled to the storage means and to the compensation circuit and being responsive to said control signal $V_c$ for operating the compensation circuit in accordance with said offset correction value or a function thereof.

45. The TCO according to claim 44, wherein the ACO is a voltage controlled oscillator (VCO) said control signal being a voltage signal.

46. The TCO according to claim 44, wherein the aging calibration is effected during normal operation of the TCO.

47. The TCO according to claim 44, wherein the ACO is a crystal based signal-controlled oscillator.

48. The TCO according to claim 44, wherein the ACO is based on a dielectric resonator oscillator.

49. The TCO according to claim 44, wherein the dedicated aging calibration circuit is based on a phase lock loop.

50. The TCO according to claim 44, wherein the reference signal coupling means includes a frequency matching circuit for matching the reference frequency to the output of the TCO.

51. The TCO according to claim 44, wherein the dedicated aging calibration circuit is integral with the TCO.

52. The TCO according to claim 44, wherein the dedicated aging calibration circuit is only partially integrated in the TCO.

53. The TCO according to claim 44, wherein the selector means includes a coupling means for coupling an external selection signal thereto and is responsive to said external selection signal.

54. The TCO according to claim 53, wherein the selector means is responsive to the reference signal for selecting the aging calibration mode of operation.

55. The TCO according to claim 44, wherein the transducer means comprises:
   an A/D converter coupled to the temperature sensor for converting the analog signal to a corresponding digital temperature value,
   a memory coupled to the A/D converter and having at least one memory location for storing therein a respective digital control value,
   digital processing means coupled to the A/D converter and to the memory and responsive to the respective digital control value and to the measured temperature for producing a digital signal representative of the analog control signal $V_c$, and
   a D/A converter coupled to an output of the digital processing means for converting said digital signal to said analog signal $V_c$.

56. The TCO according to claim 44, wherein the offset correction has a value which is constant over the temperature range and is added to the analog control signal $V_c$.

57. The TCO according to claim 44, wherein the offset correction means is responsive to the offset correction for selecting one of a plurality of pre-stored temperature-dependent compensation signals.

58. The TCO according to claim 44, wherein the offset correction means is responsive to the offset correction for deriving said function based on at least two pre-stored temperature-dependent compensation signals.

59. A method for effecting aging compensation using the TCO according to claim 58, comprising the steps of:
   storing at least two signal-temperature characteristics $V_1(T)$ and $V_2(T)$ in the memory,
   determining the value of the required control signal $V_c$ at at least one temperature $T_1$ as a linear function of $V_1(T_1)$ and $V_2(T_1)$ so as to derive a coefficient $\rho$ which when applied to $V_1(T_1)$ and $V_2(T_1)$ produces the correct signal for the temperature $T_1$,
   storing the coefficient $\rho$, and
   during subsequent compensation, applying the coefficient $\rho$ as a linear function to the instantaneous values of the at least two signal-temperature characteristics $V_1(T)$ and $V_2(T)$ at the measured ambient temperature so as to derive the correct control signal $V_c$.

60. A TCO comprising a calibration specific circuit active only in calibration mode for determining and storing at least one compensation value or function thereof for operating in conjunction with a compensation circuit including therein an analog controlled oscillator (ACO) having an output frequency controllable by an analog control signal $V_c$, to compensate for variations in temperature, the TCO further comprising a dedicated aging calibration circuit for determining and storing at least one value for operating in conjunction with the compensation circuit so as to compensate for aging of the oscillator, wherein:
   the calibration specific circuit comprises:
      reference signal coupling means for coupling thereto an external signal having an accurate reference frequency,
      control means coupled to the reference signal coupling means and to the compensation circuit for determining the digital control value which, when processed by the digital processing means in the compensation circuit, produces the control signal $V_c$ corresponding to the measured ambient temperature of the ACO, and
      data entry means for entering said digital control value into the memory at said at least one location thereof;
   the dedicated aging calibration circuit comprises:
      reference signal coupling means for coupling thereto an external signal having an accurate reference frequency,
      control means coupled to the reference signal coupling means and to the ACO for determining an offset correction value or a function thereof which operates in conjunction with the compensation circuit so as to produce the control signal $V_c$ corresponding to the measured ambient temperature of the ACO,
      storage means for storing said offset correction value or said function thereof, and
      offset correction means coupled to the storage means and to the compensation circuit and being responsive to said control signal $V_c$ for operating the compensation circuit in accordance with said offset correction value or a function thereof; and wherein
   the calibration specific circuit and the dedicated aging calibration circuit employing shared components.

61. A method for effecting aging compensation for a temperature controlled oscillator (TCO) comprising:
   a compensation circuit having an analog controlled oscillator (ACO) having an output frequency controlled by an analog control signal $V_c$ for compensating for changes in temperature, and
   a dedicated aging calibration circuit responsive to an input signal of accurate known frequency for producing an aging correction signal in conjunction with which the compensation circuit may be operated so as to modify the analog control signal $V_c$ applied to the ACO so as to produce a desired output frequency;
   said method being performed at at least one non-specific temperature and comprising the steps of:
   (a) connecting an accurate frequency source to the TCOs for producing at least one aging offset correction value,
   (b) selecting a "calibration mode" of operation wherein said aging offset correction value or a function thereof is determined for a measured ambient temperature,
   (c) storing the value of the aging offset correction value or a function thereof in the memory of the device,
   (d) disconnecting the frequency source,
   (e) selecting a "compensation mode" of operation wherein said aging offset correction value or a function thereof is extracted from the memory and extrapolated in respect of a measure ambient temperature,
   (f) processing said offset correction value or a function thereof so as to derive the aging correction signal, and
   (g) operating the compensation circuit in conjunction with the aging correction signal so as to modify the analog control signal $V_c$.

62. The method according to claim 61, when being effected during normal operation of the TCO.

63. The method according to claim 61, wherein the ACO is a crystal based analog-control oscillator.

64. The method according to claim 61, wherein the ACO is a dielectric resonator oscillator.

65. The method according to claim 61, wherein the reference frequency is a multiple m/n of the desired frequency where m and n are integers.

66. The method according to claim 61, wherein step (b) is effected automatically on connecting the frequency source in step (a).

* * * * *